(12) United States Patent
Oshima

(10) Patent No.: US 7,782,157 B2
(45) Date of Patent: Aug. 24, 2010

(54) RESONANT CIRCUIT, FILTER CIRCUIT, AND MULTILAYERED SUBSTRATE

(75) Inventor: Shimpei Oshima, Gunma (JP)

(73) Assignee: Taiyo Yuden Co., Ltd. (JP)

( * ) Notice: Subject to any disclaimer, the term of this patent is extended or adjusted under 35 U.S.C. 154(b) by 167 days.

(21) Appl. No.: 11/642,415

(22) Filed: Dec. 20, 2006

(65) Prior Publication Data

US 2007/0188273 A1    Aug. 16, 2007

(30) Foreign Application Priority Data

Dec. 27, 2005    (JP) ............................. 2005-375484

(51) Int. Cl.
 *H03H 7/01* (2006.01)
 *H01P 1/203* (2006.01)
(52) U.S. Cl. ...................... 333/185; 333/204
(58) Field of Classification Search ................. 333/204, 333/185
See application file for complete search history.

(56) References Cited

U.S. PATENT DOCUMENTS

| | | | | |
|---|---|---|---|---|
| 4,382,238 | A * | 5/1983 | Makimoto et al. | 333/134 |
| 5,202,651 | A * | 4/1993 | Yoshimasu | 333/170 |
| 6,236,290 | B1 * | 5/2001 | Abe et al. | 333/185 |
| 6,300,849 | B1 * | 10/2001 | Takeda | 333/202 |
| 6,621,370 | B1 * | 9/2003 | Dao | 333/25 |
| 6,711,394 | B2 * | 3/2004 | Abdelmonem | 455/307 |
| 7,099,645 | B2 * | 8/2006 | Shingaki et al. | 455/307 |
| 7,262,675 | B2 * | 8/2007 | Lee et al. | 333/185 |

FOREIGN PATENT DOCUMENTS

| | | | |
|---|---|---|---|
| GB | 813962 | | 5/1957 |
| JP | 58-190113 | | 11/1983 |
| JP | 59-013403 | | 1/1984 |
| JP | 06252603 | A * | 9/1994 |
| JP | 10-126104 | | 5/1998 |

* cited by examiner

*Primary Examiner*—Benny Lee
*Assistant Examiner*—Alan Wong
(74) *Attorney, Agent, or Firm*—Chen Yoshimura LLP

(57) ABSTRACT

In a band-pass filter using at least one resonant circuit, a resonant circuit having multiple matching frequencies, a filter circuit having an attenuation pole at a lower/higher frequency of a pass band using the resonant circuit, and a multilayered substrate using the resonant circuit are provided. The resonant circuit includes an input transmission line, an output transmission line of which an input terminal is connected to an output terminal of the input transmission line, a first capacitor of which one terminal is connected to an input terminal of the input transmission line and the other terminal is connected to an output terminal of the output transmission line, a main resonant transmission line of which one end of is connected to an output terminal of the input transmission line, and a second capacitor of which one end is connected to the other side of the resonance main transmission line and the other side is grounded.

8 Claims, 14 Drawing Sheets

[Fig. 1]
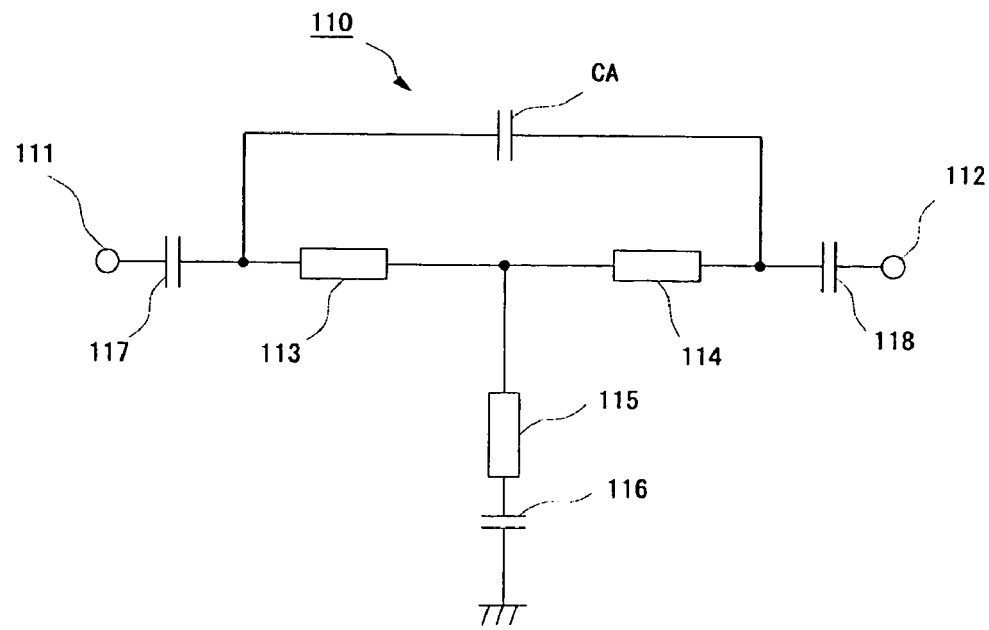
[Fig. 2]
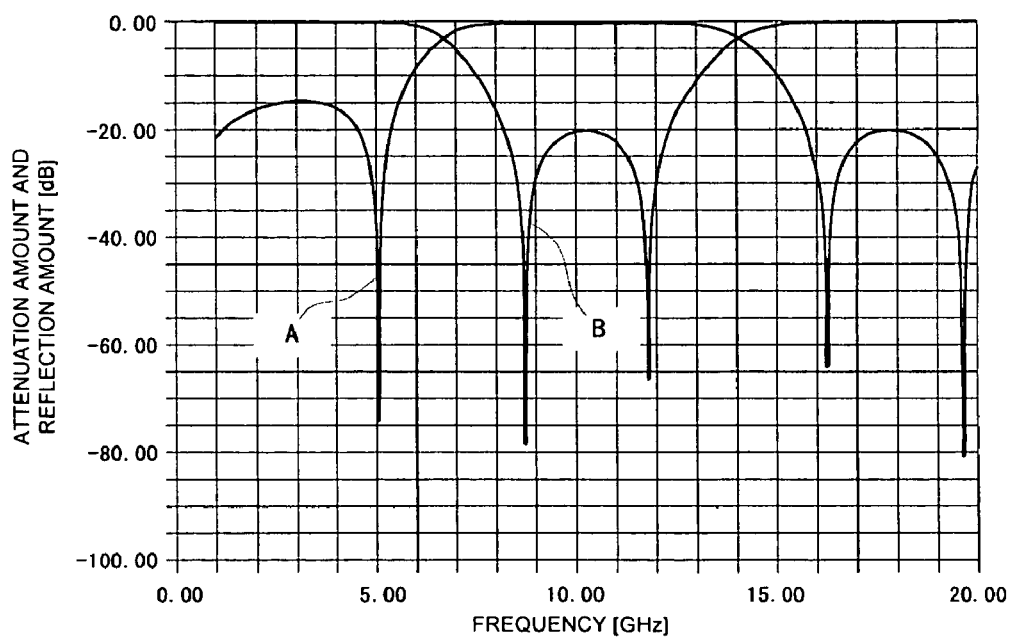

[Fig. 3]
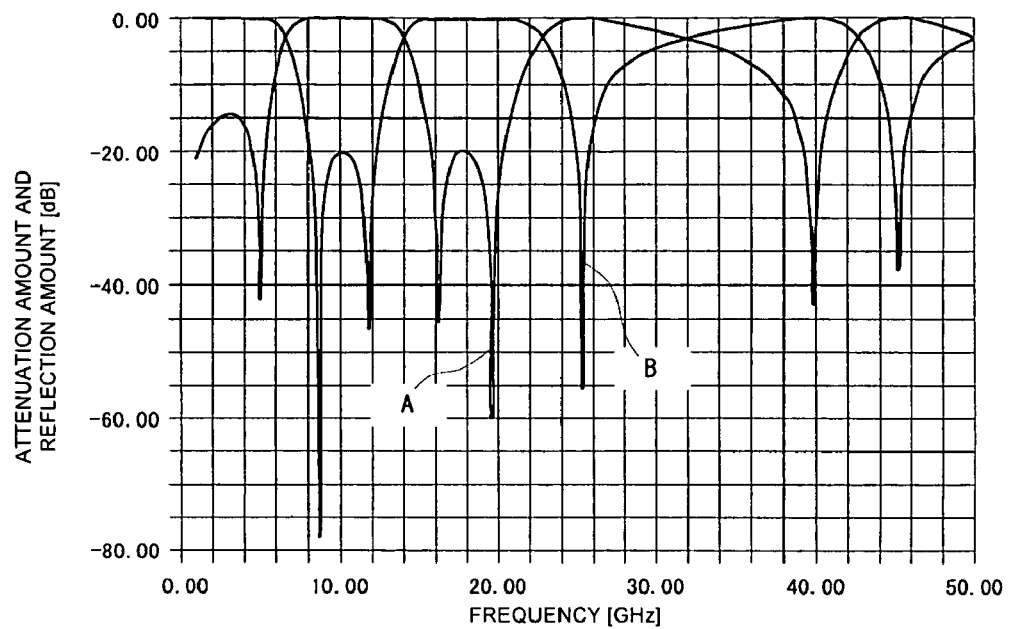
[Fig. 4]
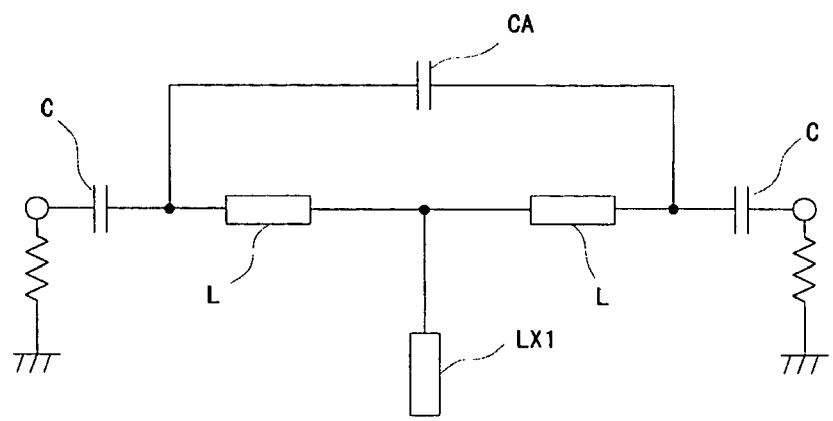

[Fig. 5]
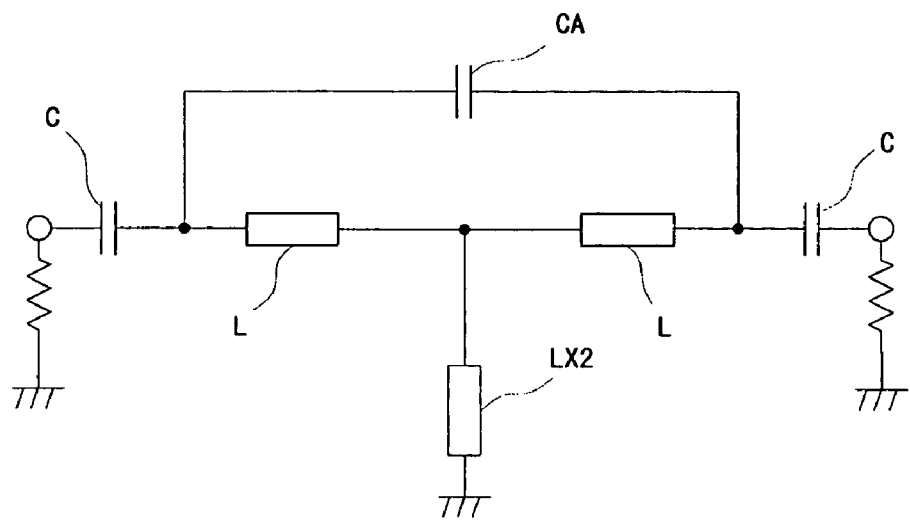
[Fig. 6]
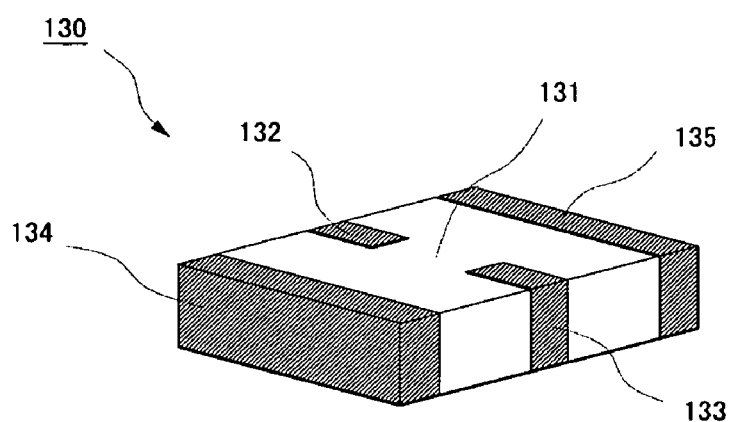

[Fig. 7]
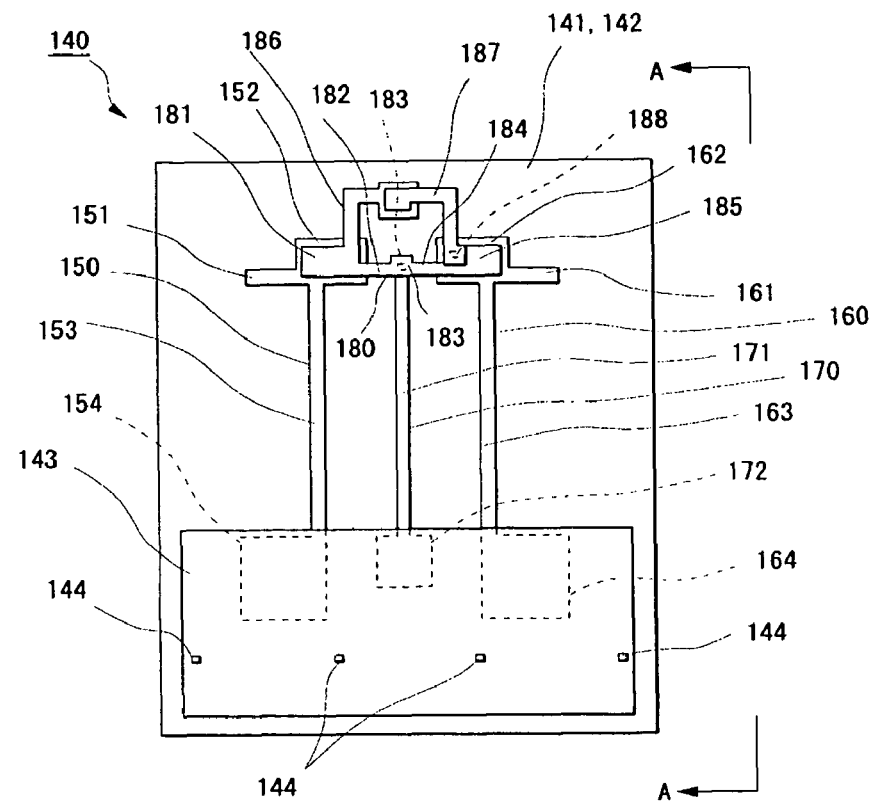
[Fig. 8]
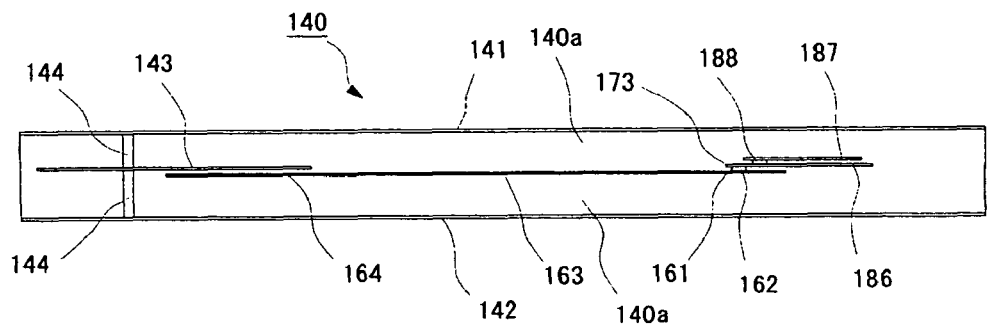

[Fig. 9]
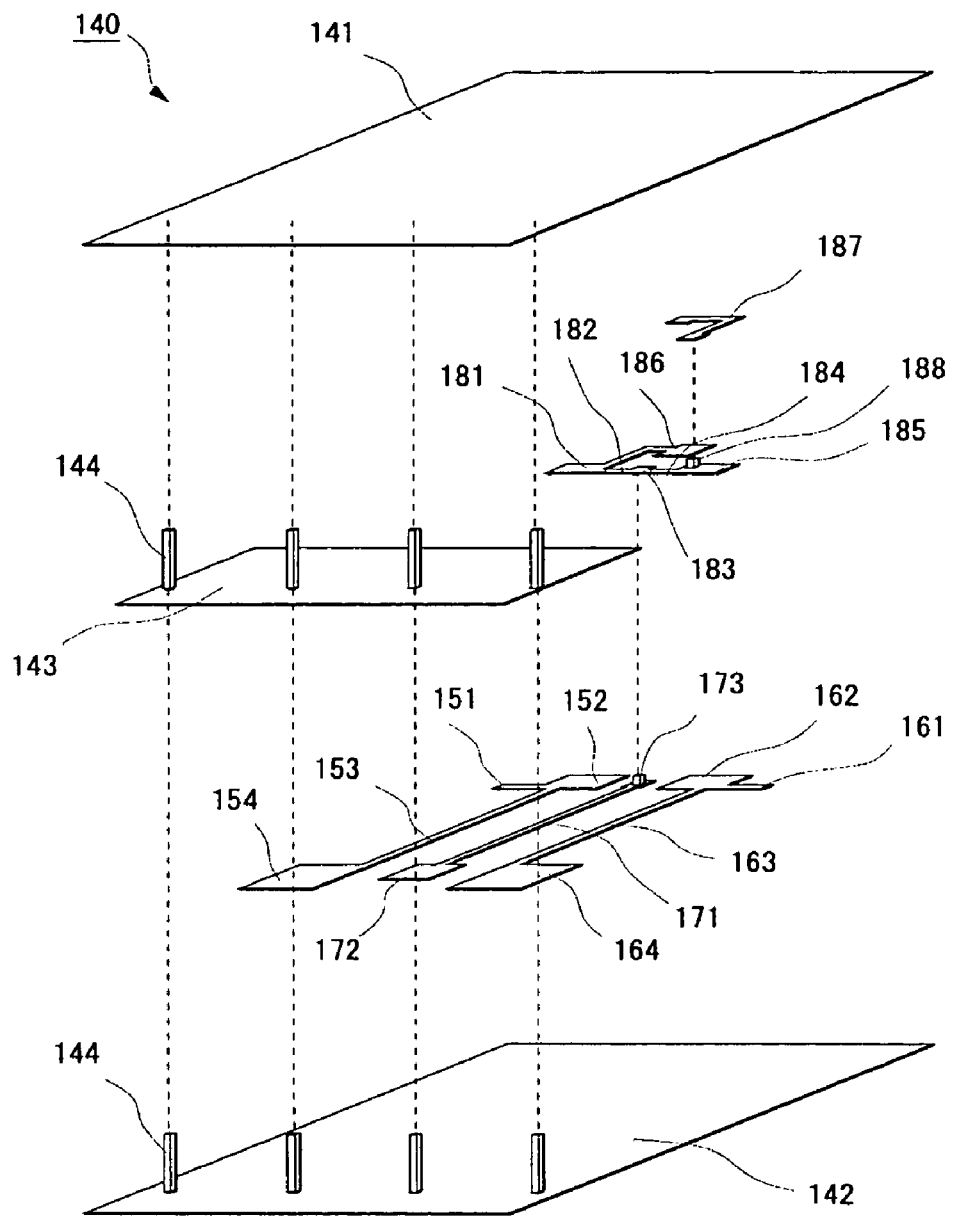

[Fig. 10]
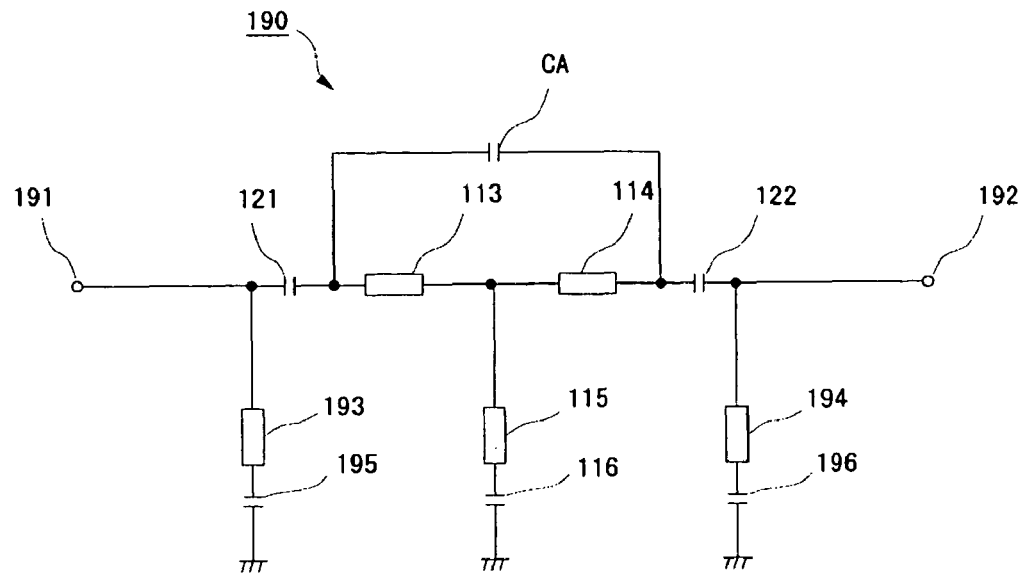
[Fig. 11]
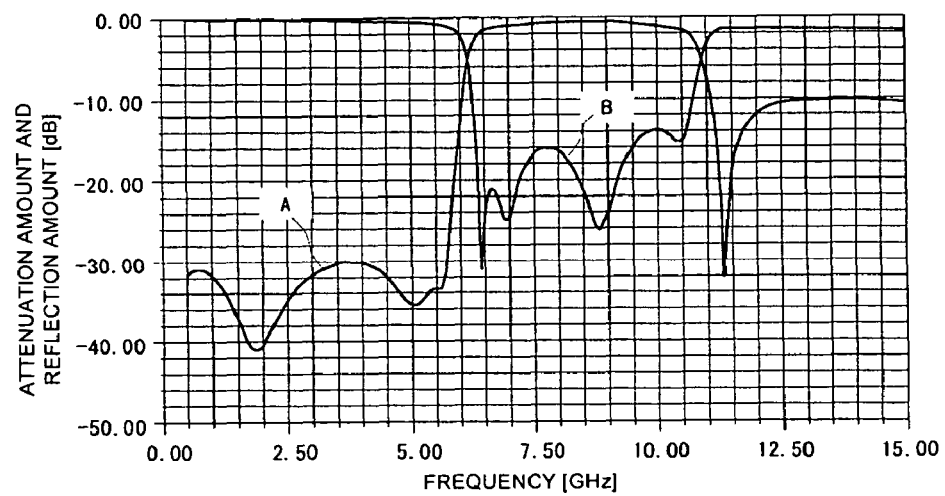

[Fig. 12]
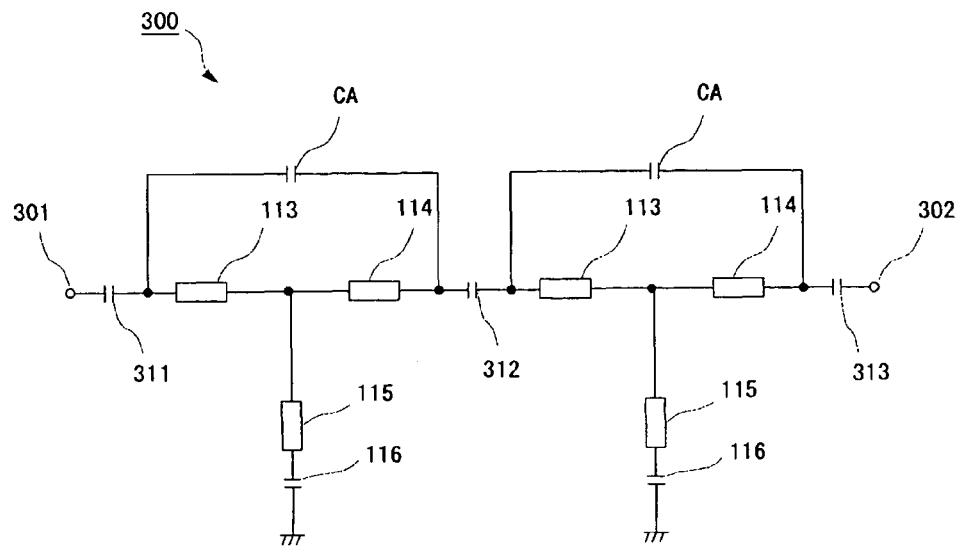
[Fig. 13]
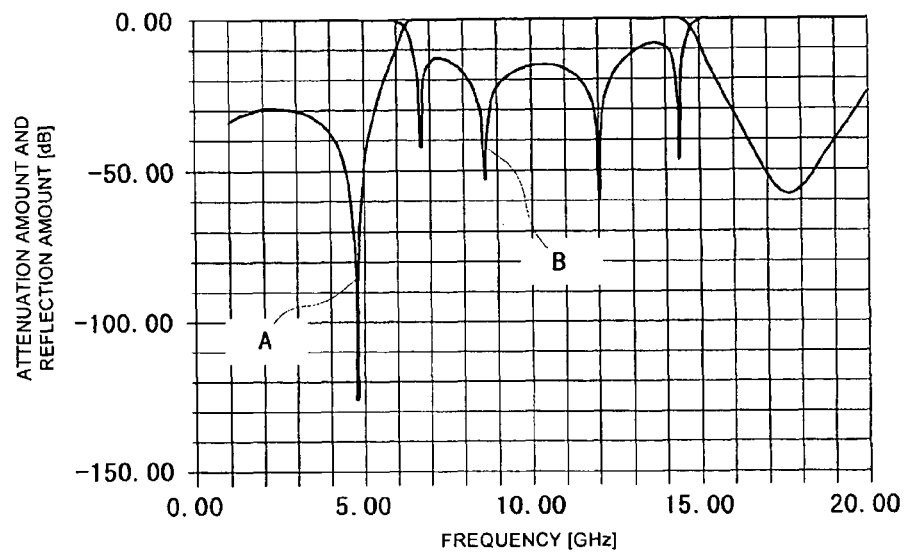

[Fig. 14]
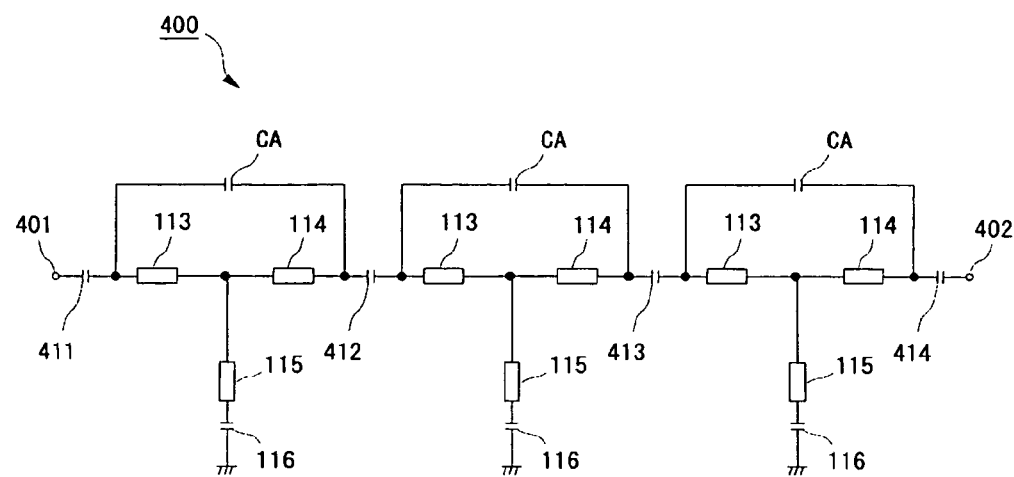
[Fig. 15]
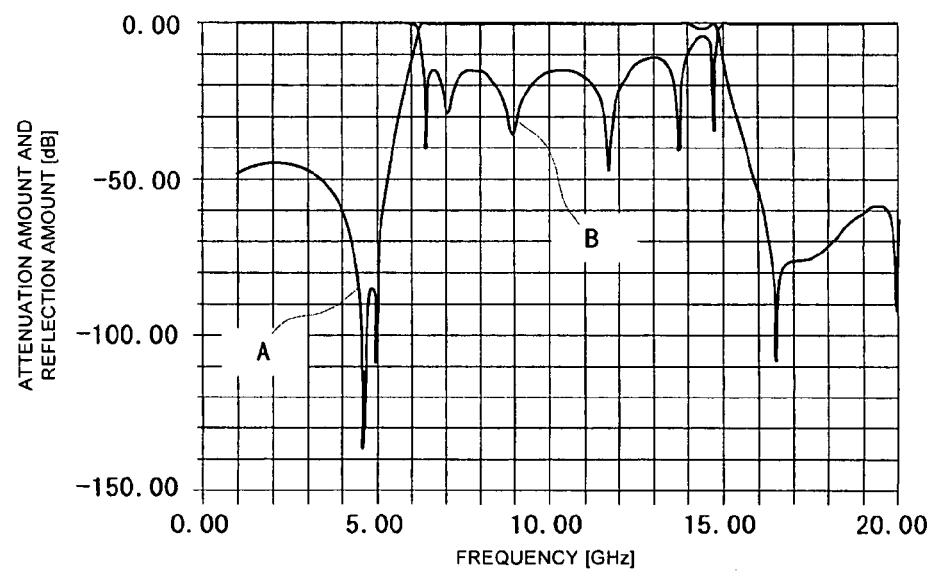

[Fig. 16]
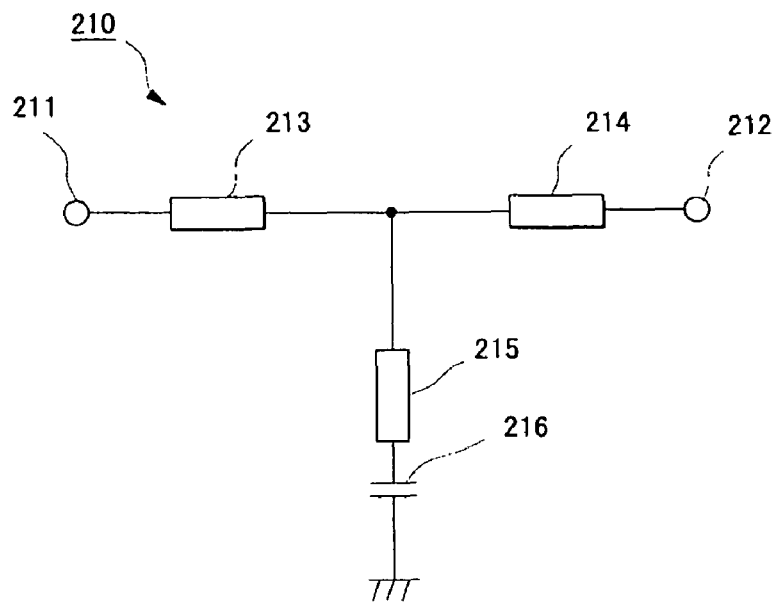
PRIOR ART
[Fig. 17]
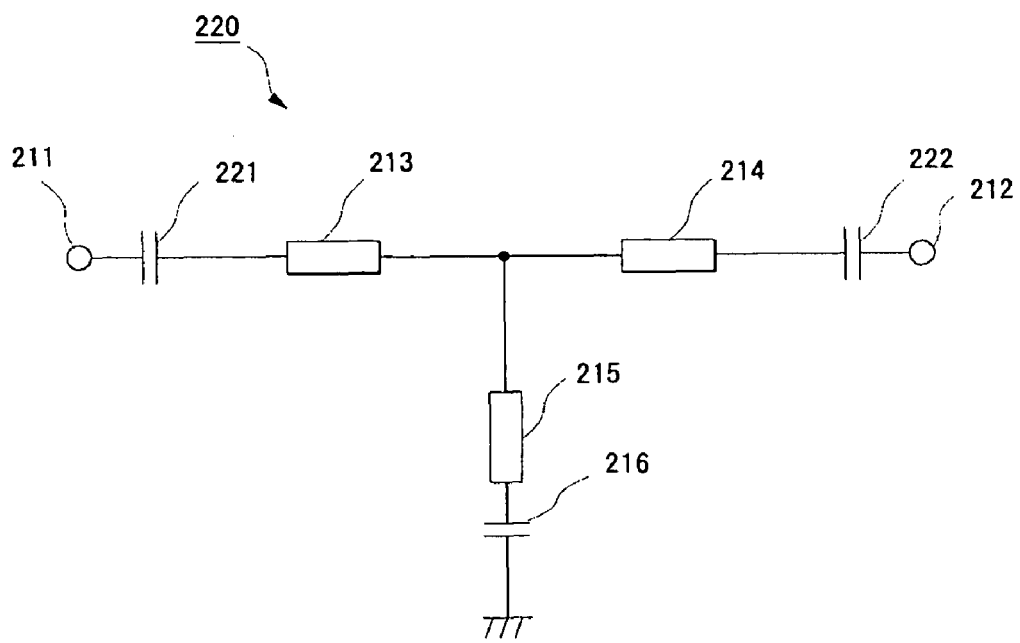
PRIOR ART

[Fig. 18]
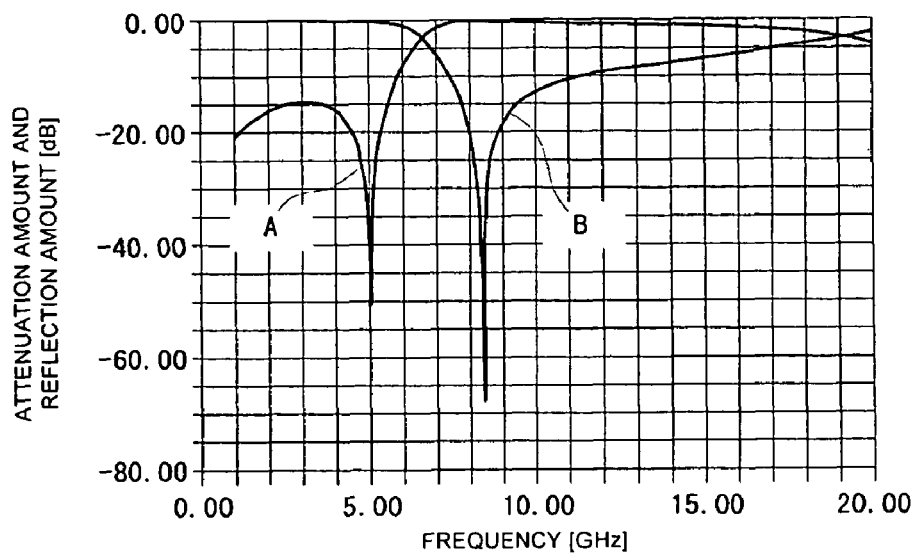
PRIOR ART
[Fig. 19]
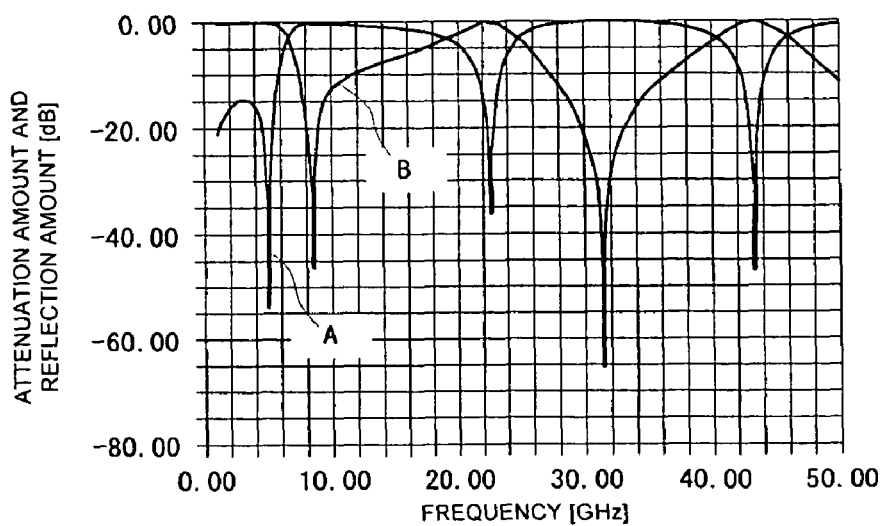
PRIOR ART

[Fig. 20]
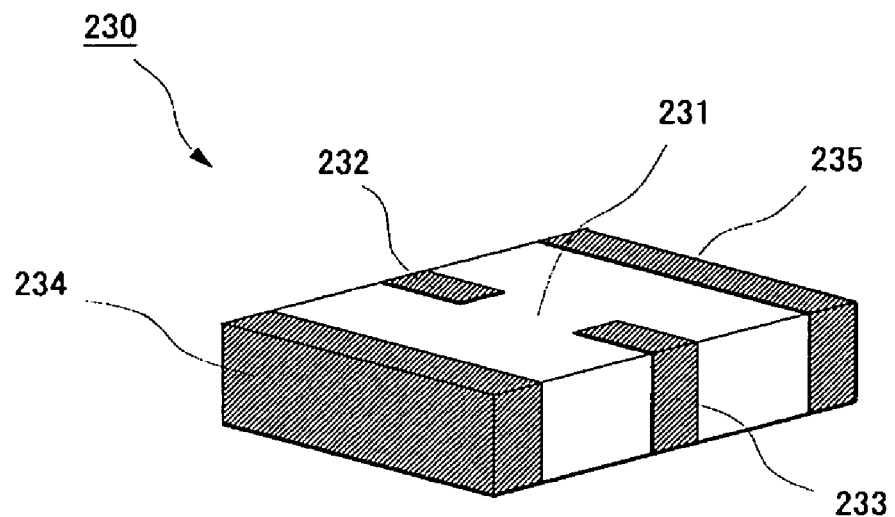
PRIOR ART

[Fig. 21]
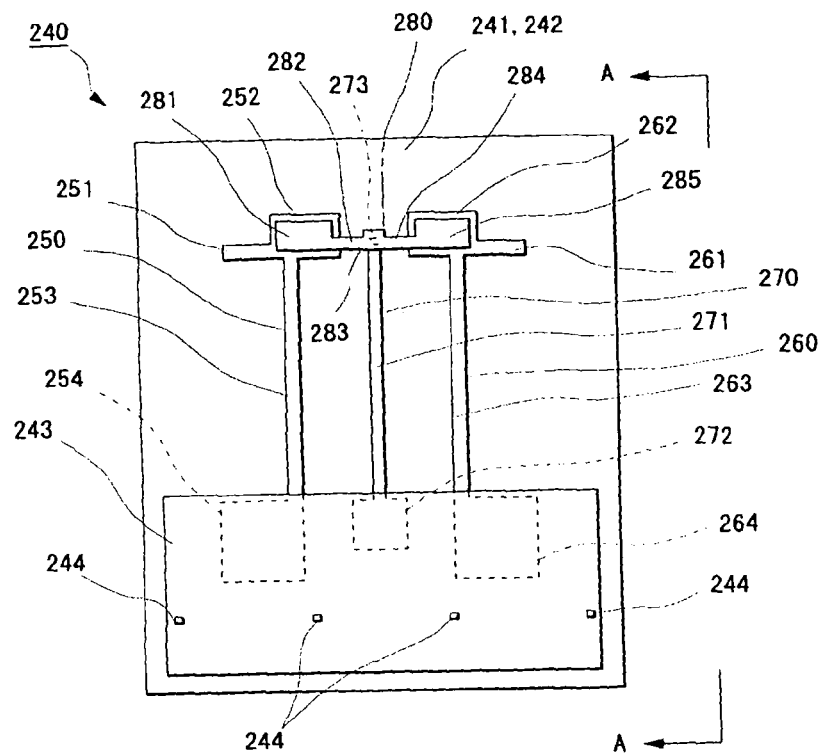
PRIOR ART
[Fig. 22]
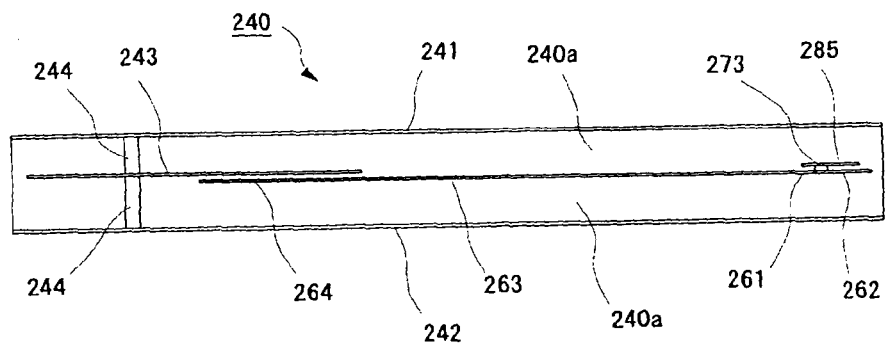
PRIOR ART

[Fig. 23]
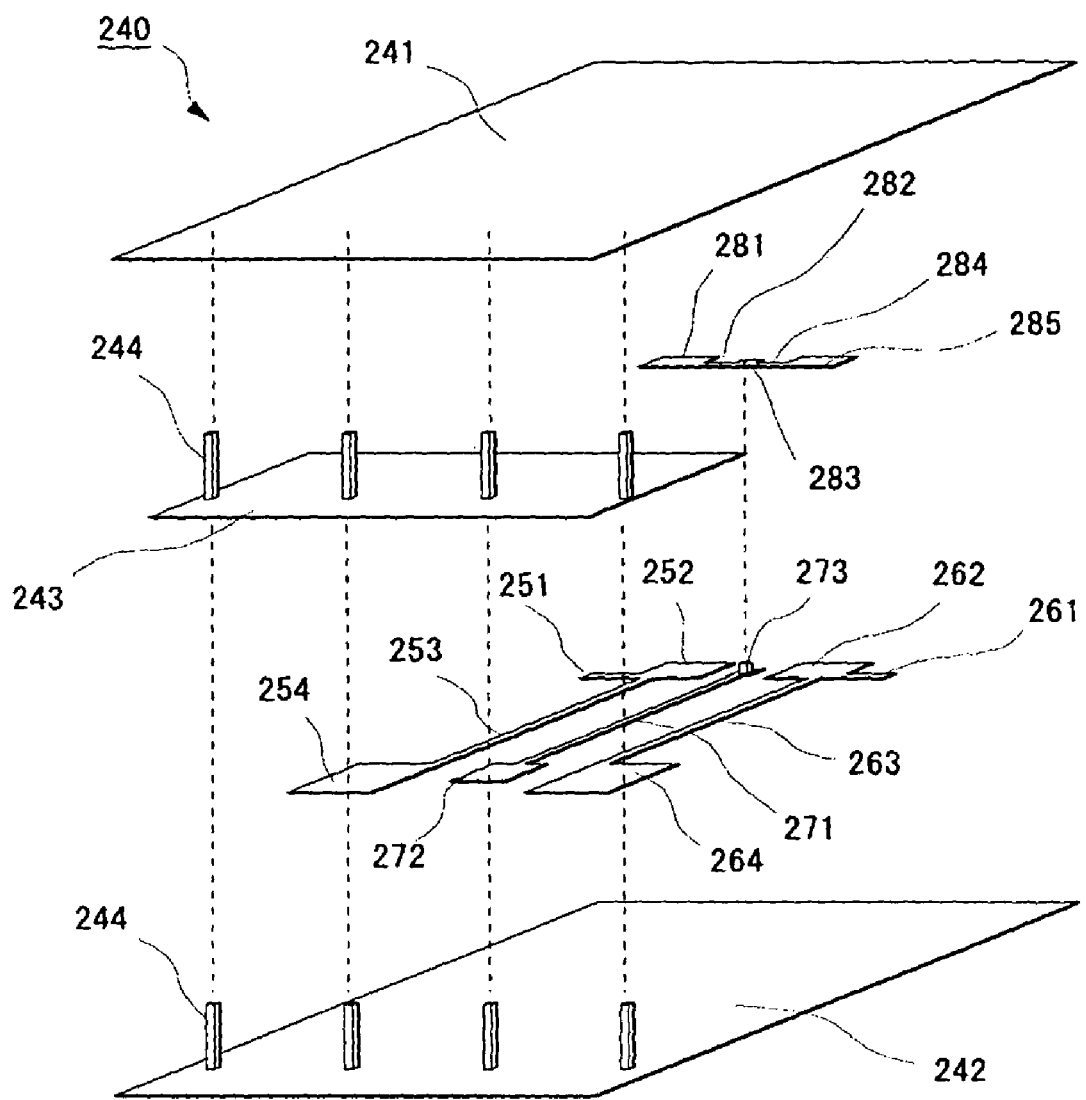
PRIOR ART

[Fig. 24]
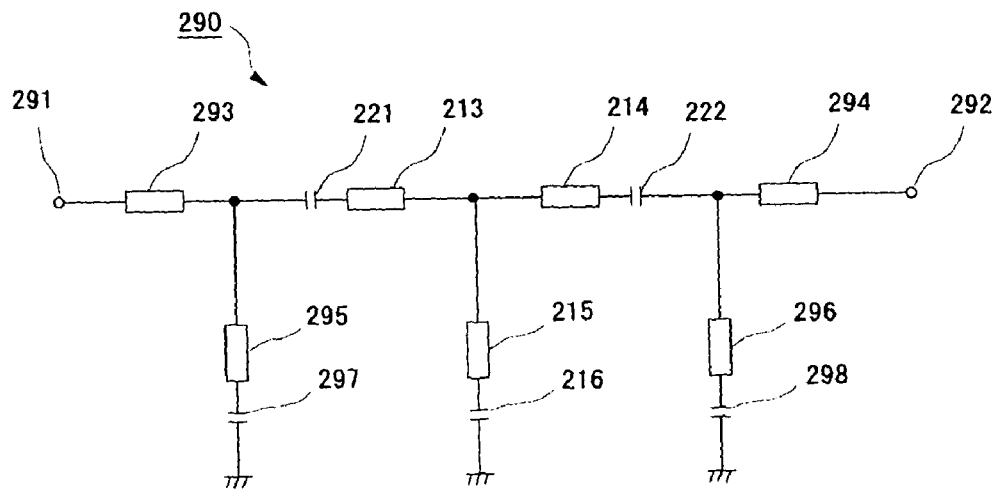
PRIOR ART
[Fig. 25]
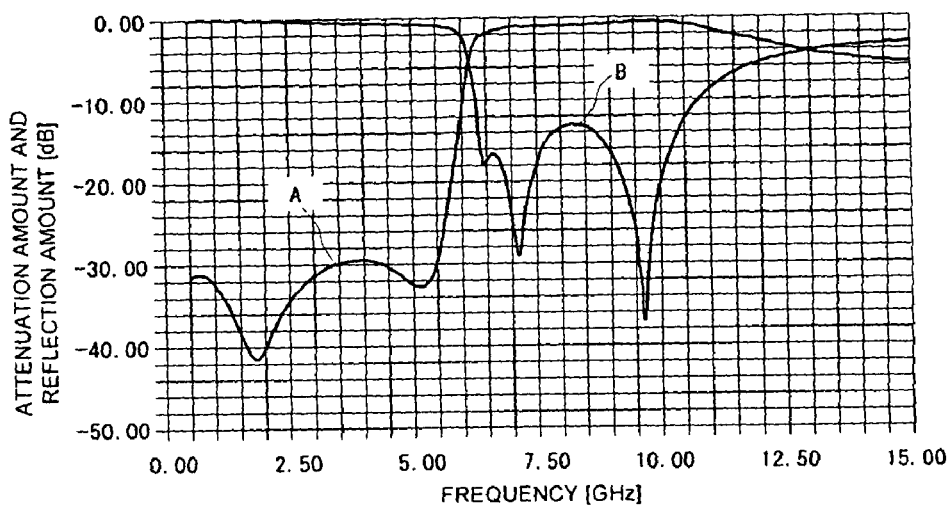
PRIOR ART

RESONANT CIRCUIT, FILTER CIRCUIT, AND MULTILAYERED SUBSTRATE

BACKGROUND OF THE INVENTION

1. Field of the Invention

The present invention relates to a resonant circuit, a filter circuit, and a multilayered substrate which are applicable to a broadband wireless system.

2. Description of the Related Art

Recently, development of wireless systems using broadband has been considered. In a wireless system using broadband, a band-pass filter (BPF) which filters required signals and unnecessary signals should match the broadband and preferably has a low insertion loss.

Examples of a resonant circuit, a filter circuit, and a multilayered substrate for being used for broadband which are based on general technology will now be described.

FIG. 16 is a diagram showing a general resonant circuit. FIG. 17 is a diagram showing a general filter circuit. FIGS. 18 and 19 are diagrams showing the frequency characteristics of a general filter circuit. FIG. 20 is a perspective view showing an external shape of a general filter element. FIG. 21 is a schematic plan perspective view showing a general multilayered substrate. FIG. 22 is a schematic side perspective view showing a general multilayered substrate. FIG. 23 is a schematic exploded perspective view showing a general multilayered substrate. FIG. 24 is an equivalent circuit of a filter circuit in a general multilayered substrate. FIG. 25 is a diagram showing the frequency characteristic of a filter circuit on a general multilayered substrate.

As shown in FIG. 16, the resonant circuit based on the general technology which is used in the BPF includes transmission lines 213 and 214 which are connected in series between input and output terminals 211 and 212, a transmission line 215 connected to a junction of the transmission lines 213 and 214 and the ground, and a capacitor 216 connected between the transmission line 215 and the ground.

A filter circuit 220 which forms a BPF having a pass band of 6 to 10 GHz using the resonant circuit 210, as shown in FIG. 17, includes a capacitor 221 interposed between the input terminal 211 and the input transmission line 213 and a capacitor 222 interposed between the output terminal 212 and the output transmission line 214.

A frequency characteristic of the filter circuit 220 is as shown in FIGS. 18 and 19. In each of the figures, a curve A is an attenuation characteristic curve, and a curve B is a reflection amount characteristic curve. In addition, a vertical axis represents an attenuation amount and a reflection amount in units of dB, and a horizontal axis represents a frequency in units of GHz. As the attenuation characteristic curves A in the figures indicate, the attenuation amount has local maximal values at frequencies of 5 GHz, 22.5 GHz, and 43.5 GHz. As the reflection amount characteristic curves B in the figures indicate, the reflection amount has local minimal values at frequencies of 8.5 GHz and 31.5 GHz.

An example of an external shape of a filter element 230 is shown in FIG. 20, when the filter circuit 220 is formed as a circuit element. The filter element 230 is formed by stacking the filter circuit 220 inside a layered product 231 having a rectangular parallelepiped shape which is made mainly of dielectric ceramics. In addition, on a surface of the layered product 231, external terminal electrodes 232 to 235 are formed. Here, an external terminal electrode 232 corresponds to the input terminal 211, and an external terminal electrode 233 corresponds to the output terminal 212. In addition, external terminal electrodes 234 and 235 are earth terminals.

The shape and disposition of a conductor pattern are shown in FIGS. 21 to 23, when another exemplary BPF to which the filter circuit 220 is applied is formed inside the multilayered substrate.

In FIGS. 21 to 23, a reference numeral 240 denotes a multilayered substrate which is made mainly of dielectric ceramics. Inside the multilayered substrate 240, a filter circuit 290 to be described later (shown in FIG. 24) is formed by stacking multiple conductor patterns. Described in more details, in the multilayered substrate 240, on both sides of a portion in which the filter circuit 290 is formed, earth conductor patterns 241 and 242 parallel to each other are disposed, respectively. In addition, between the earth conductor patterns 241 and 242, an earth conductor pattern 243 having a predetermined size is formed to be parallel to the earth conductor patterns 241 and 242. The earth conductor pattern 243 is electrically connected to the earth conductor patterns 241 and 242 through a plurality of via conductors 244. In addition, between the earth conductor patterns 241 and 242, an input conductor pattern 250, an output conductor pattern 260, a resonance conductor pattern 270, and a connection conductor pattern 280 are formed.

The input conductor pattern 250 is formed to be parallel to the earth conductor patterns 241 and 242. The input conductor pattern 250 includes an input strip line 251, a capacitor electrode 252 connected thereto, a strip line 253 of which one end is connected to the capacitor electrode 252, and a capacitor electrode 254 which is connected to the other end of the strip line 253. Here, only the capacitor electrode 254 is disposed to face the earth conductor pattern 243.

The output conductor pattern 260 is formed to be parallel to the earth conductor patterns 241 and 242 and to be on a same side as the input conductor pattern 250. The output conductor pattern 260 includes an output strip line 261, a capacitor electrode 262 connected thereto, a strip line 263 of which one end is connected to the capacitor electrode 262 and which is disposed parallel to the strip line 253, and a capacitor electrode 264 which is connected to the other end of the strip line 263. Here, only the capacitor electrode 264 is disposed to face the earth conductor pattern 243.

The resonance conductor pattern 270 includes a strip line 271 which is interposed between the input and output conductor patterns 250 and 260, formed to be on a same side as the input and output conductor patterns 250 and 260, and disposed to be parallel to the strip line 253 and a capacitor electrode 272 which is connected to one end of the strip line 271. Here, only the capacitor electrode 272 is disposed to face the earth conductor pattern 243.

The connection conductor pattern 280 is disposed by disposing dielectric ceramics 240a on a layer different from a layer on which the input conductor pattern 250, the output conductor pattern 260, and the resonance conductor pattern 270 are disposed. The connection conductor pattern 280 includes a capacitor electrode 281 which is disposed to face the capacitor electrode 252, a capacitor electrode 285 which is disposed to face the capacitor electrode 262, a strip line 282 of which one end is connected to the capacitor electrode 281, a connection electrode 283 which is connected to the other end of the strip line 282, and a strip line 284 of which one end is connected to the connection electrode 283 and the other end is connected to the capacitor electrode 285. In addition, the connection electrode 283 is connected to one end of the strip line 271 through a via conductor 273.

The filter circuit which is formed in the multilayered substrate 240 as illustrated in FIGS. 21, 22, and 23 is as shown in FIG. 24. In the aforementioned structure, components of the equivalent circuit shown in FIG. 24 will now be described.

A transmission line 293 connected to an input terminal 291 is constructed by the strip line 251, and a capacitor 221 is constructed by the capacitor electrodes 252 and 281. In addition, a transmission line 213 is constructed by the strip line 282.

In addition, a transmission line 294 which is connected to an output terminal 292 is constructed by the strip line 261, and a capacitor 222 is constructed by the capacitor electrodes 262 and 285. In addition, a transmission line 214 is constructed by the strip line 284.

In addition, a series resonant circuit including the transmission line 215 and the capacitor 216 is constructed by the strip line 271, and the capacitor electrode 272, and the earth conductor pattern 243.

In addition, a series resonant circuit including a transmission line 295 which is connected to a junction of the transmission line 293 and the capacitor 221 and a capacitor 297 is constructed by the strip line 253, the capacitor electrode 254, and the earth conductor pattern 243. In addition, a series resonant circuit including a transmission line 296 which is connected to a junction of the transmission line 294 and the capacitor 222 and a capacitor 298 is constructed by the strip line 263, the capacitor electrode 264, and the earth conductor pattern 243.

The frequency characteristic of the filter circuit 290, that is a BPF, in the multilayered substrate 240 constructed as described above is as shown in FIG. 25. In the figure, a curve A is an attenuation characteristic curve, and a curve B is a reflection amount characteristic curve. In addition, a vertical axis represents an attenuation amount and a reflection amount in units of dB, and a horizontal axis represents a frequency in units of GHz. As the attenuation characteristic curve A in the figure indicates, the attenuation amount has local maximal values at frequencies of 1.8 GHz and 5.2 GHz. In addition, as the reflection amount characteristic curve B in the figure indicates, the reflection amount has local minimal values at frequencies of 7.1 GHz and 9.6 GHz. The filter circuit 290 is designed on the basis of the filter circuit 220 described above to have a pass band of 6 to 10 GHz.

In order to implement the filter element 230 shown in FIGS. 17 and 20, the strip lines 251 and 253 and capacitor electrode 254 which are included in the input conductor pattern 250 shown in FIGS. 21 to 23 and the strip lines 261 and 263 and the capacitor electrode 264 which are included in the output conductor pattern 260 shown in FIGS. 21 to 23 can be removed.

The resonant circuit 210, the filter circuit 220, the filter element 230, and the multilayered substrate 240 which are described above are according to a general embodiment. Accordingly, as a different type of a BPF which can be used in another embodiment, a BPF which is disclosed in JP A-10-126104 is known.

However, as in the general embodiment described above, when the band pass filter (BPF) is constructed by using one resonant circuit, there is only one matching frequency at which the reflection amount becomes an extreme value, and accordingly it is difficult to maintain low insertion loss in the broadband. Although the number of matching frequencies may be increased by using a BPF which is formed by configuring multiple stages of the aforementioned resonant circuit, the configuration of multiple stages of the resonant circuits results in an increase in a circuit size and insertion loss. In addition, as shown in FIG. 25, in the BPF which is constructed by multiple stages of the resonant circuits, at an upper cutoff frequency which is in the proximity of pass band, an attenuation pole does not appear, and accordingly the BPF has a characteristic close to a substantial high-pass filter.

SUMMARY OF THE INVENTION

It is an object of the invention to provide a small-sized resonant circuit which can construct a BPF having multiple matching frequencies.

Further, it is another object of the invention to provide a filter circuit which has an attenuation pole at a higher or lower frequency (lower range) in proximity of a pass band using the resonant circuit.

Furthermore, it is still another object of the invention to provide a multilayered substrate including the resonant circuit.

According to an aspect of the invention, a resonant circuit includes: an input transmission line; an output transmission line of which an input terminal is connected to an output terminal of the input transmission line; a first capacitor of which one terminal is connected to an input terminal of the input transmission line and the other terminal is connected to an output terminal of the output transmission line; a main resonant portion of which one terminal is connected to an output terminal of the input transmission line; a second capacitor of which one terminal serves as an input terminal and the other terminal is connected to the input terminal of the input transmission line; and a third capacitor of which one terminal is connected to the output terminal of the output transmission line and the other terminal serves as an output terminal.

When a BPF is configured by using a resonant circuit according to the embodiment of the present invention, the number of matching frequencies at which reflection amounts become extreme values is increased by one owing to addition of a first capacitor when compared with a case where the first capacitor is not added to be able to match a broadband, and accordingly low insertion loss can be maintained. In addition, it is possible to form an attenuation pole in an attenuation zone having high frequencies to implement an excellent attenuation characteristic.

According to another aspect of the invention, a multilayered substrate in which an electronic circuit including conductor patterns is buried in a multilayer body, the multilayered substrate including a circuit resonant portion includes: an input transmission line portion; an output transmission line portion of which an input terminal is connected to an output terminal of the input transmission line portion; a first capacitor portion of which one terminal is connected to an input terminal of the input transmission line portion and the other terminal is connected to an output terminal of the output transmission line portion; a main resonant portion of which one terminal is connected to an output terminal of the input transmission line portion; a second capacitor portion which is connected to the input terminal of the input transmission line portion; and a third capacitor portion which is connected to the output terminal of the output transmission line portion.

In a multilayered substrate according to the embodiment of the present invention, a BPF is configured by each transmission line portion, the number of matching frequencies at which reflection amounts become extreme values is increased by one owing to addition of a first capacitor when compared with a case where the capacitor is not added to be able to mach a broadband, and accordingly it is possible to maintain low insertion loss. In addition, an attenuation zone can be formed at a higher cutoff frequency, and accordingly it is possible to implement an excellent attenuation characteristic.

When a BPF is configured by using a resonant circuit according to an embodiment of the present invention, the number of matching frequencies at which reflection amounts become extreme values is increased by one owing to addition of a first capacitor when compared with a case where the first capacitor is not added, and it is possible to form an attenuation pole in an attenuation zone having high frequencies.

In a filter circuit according to an embodiment of the present invention, a BPF is configured, the number of matching frequencies at which reflection amounts become extreme values is increased by one owing to addition of a first capacitor when compared with a case where the first capacitor is not added, and it is possible to match a broadband. As a result, it is possible to maintain low insertion loss and to form an attenuation zone at a higher cutoff frequency in the filter circuit, and accordingly the filter circuit can represent an excellent attenuation characteristic.

In a multilayered substrate according to an embodiment of the present invention, a BPF is configured by each transmission line portion, the number of matching frequencies at which reflection amounts become extreme values is increased by one owing to addition of a first capacitor when compared with a case where the capacitor is not added, and it is possible to match a broadband. As a result, it is possible to maintain low insertion loss and to form an attenuation zone at a higher cutoff frequency in the multilayered substrate, and accordingly the multilayered substrate can represent an excellent attenuation characteristic.

BRIEF DESCRIPTION OF THE DRAWINGS

FIG. 1 is a diagram showing a resonant circuit according to an exemplary embodiment of the present invention.

FIG. 2 is a diagram showing the frequency characteristic of a resonant circuit according to an exemplary embodiment of the present invention.

FIG. 3 is a diagram showing the frequency characteristic of a resonant circuit according to an exemplary embodiment of the present invention.

FIG. 4 is a diagram illustrating an alternative circuit configuration according to another exemplary embodiment of the present invention.

FIG. 5 is a diagram illustrating an alternative circuit configuration according to another exemplary embodiment of the present invention.

FIG. 6 is a perspective view showing an external shape of a filter element using a resonant circuit according to an exemplary embodiment of the present invention.

FIG. 7 is a schematic plan perspective view of a multilayered substrate according to an exemplary embodiment of the present invention.

FIG. 8 is a schematic side perspective view showing a multilayered substrate according to an exemplary embodiment of the present invention.

FIG. 9 is a schematic exploded perspective view showing a multilayered substrate according to an exemplary embodiment of the present invention.

FIG. 10 is an equivalent circuit of a filter circuit formed on a multilayered substrate according to an exemplary embodiment of the present invention.

FIG. 11 is a diagram showing the frequency characteristic of a filter circuit formed on a multilayered substrate according to an exemplary embodiment of the present invention.

FIG. 12 is a circuit diagram showing a two-stage type filter circuit according to an exemplary embodiment of the present invention.

FIG. 13 is a diagram showing the frequency characteristic of a two-stage type filter circuit according to an exemplary embodiment of the present invention.

FIG. 14 is a circuit diagram showing a three-stage type filter circuit according to an exemplary embodiment of the present invention.

FIG. 15 is a diagram showing a frequency characteristic of a three-stage type filter circuit according to an exemplary embodiment of the present invention.

FIG. 16 is a diagram showing a general resonant circuit.

FIG. 17 is a diagram showing a general filter circuit.

FIG. 18 is a diagram showing the frequency characteristic of a general filter circuit.

FIG. 19 is a diagram showing the frequency characteristic of a general filter circuit.

FIG. 20 is a perspective view showing an external shape of a general filter element.

FIG. 21 is a schematic plan perspective view showing a general multilayered substrate.

FIG. 22 is a schematic side perspective view showing a general multilayered substrate.

FIG. 23 is a schematic exploded perspective view showing a general multilayered substrate.

FIG. 24 is an equivalent circuit of a filter circuit in a general multilayered substrate.

FIG. 25 is a diagram showing the frequency characteristic of a filter circuit on a general multilayered substrate.

DETAILED DESCRIPTION OF THE PREFERRED EMBODIMENT

The present invention will now be described with reference to the accompanying drawings, in which exemplary embodiments of the invention are shown.

FIG. 1 is a diagram showing a resonant circuit according to an exemplary embodiment of the present invention. FIGS. 2 and 3 are diagrams showing the frequency characteristics of a resonant circuit according to an exemplary embodiment of the present invention. FIGS. 4 and 5 are diagrams illustrating an alternative circuit configuration according to another exemplary embodiment of the present invention. FIG. 6 is a perspective view showing an external shape of a filter element using a resonant circuit according to an exemplary embodiment of the present invention. FIG. 7 is a schematic plan perspective view of a multilayered substrate according to an exemplary embodiment of the present invention. FIG. 8 is a schematic side perspective view showing a multilayered substrate according to an exemplary embodiment of the present invention. FIG. 9 is a schematic exploded perspective view showing a multilayered substrate according to an exemplary embodiment of the present invention. FIG. 10 is an equivalent circuit of a filter circuit formed on a multilayered substrate according to an exemplary embodiment of the present invention. FIG. 11 is a diagram showing the frequency characteristic of a filter circuit formed on a multilayered substrate according to an exemplary embodiment of the present invention.

As shown in FIG. 1, a resonant circuit 110 according to an embodiment of the present invention includes input and output transmission lines 113 and 114 which are connected in series between input and output terminals 111 and 112, a main resonant portion including a transmission line 115 of which one end is connected to a junction of the input and output transmission lines 113 and 114 and a capacitor 116 which is connected between the other end of the transmission line 115 and the ground, a capacitor CA connected between an input terminal of the input transmission line 113 and an output terminal of the output transmission line 114, a capacitor 117 interposed between the input terminal 111 and the input terminal of the input transmission line 113, and a capacitor 118 interposed between the output terminal 112 and the output terminal of the output transmission line 114. In the resonant circuit 110, the capacitor 116 is added to one end of the transmission line 115 to shorten a wave length of a signal. The resonant circuit 110 includes the input and output transmission lines 113 and 114 as wirings between circuit elements and the capacitor CA connected in parallel thereto.

The frequency characteristic of the resonant circuit 110 is as shown in FIGS. 2 and 3. In each one of the figures, a curve A is an attenuation characteristic curve, and a curve B is a reflection amount characteristic curve. In addition, a vertical axis represents an attenuation amount and a reflection amount in units of dB, and a horizontal axis represents a frequency in units of GHz. As the attenuation characteristic curves A in the figures indicate, the attenuation amounts have local maximal values at frequencies of 5 GHz, 16.2 GHz, 19.5 GHz, and 40.0 GHz. In addition, as the reflection amount characteristic curves B in the figures indicate, the reflection amounts have local minimal values at frequencies of 8.7 GHz, 11.8 GHz, 25.5 GHz, and 45.0 GHz.

By adding the capacitor CA as described above, the number of matching frequencies at which reflection amounts become local minimal values is increased by one from that of a general case, and it is possible to form an attenuation pole in an attenuation zone having high frequencies. In addition, since it is possible to match a band broader than a general resonant circuit, low insertion loss can be maintained, and an excellent attenuation characteristic having high frequencies (attenuation zone) can be achieved in the resonant circuit 110.

In addition, in the resonant circuit 110 according to the embodiment of the present invention, a matching frequency and an attenuation pole are added using two input and output transmission lines 113 and 114 which are interposed between the input and output capacitors 117 and 118 and a transmission line 115. As a result, the addition of an attenuation pole can be achieved with a size of the resonant circuit smaller than that of a case where, as an example, in which an attenuation pole is added by newly forming a parallel resonant circuit. This method of adding an attenuation pole makes it possible to reduce an area to be designed and to enhance a characteristic owing to reduction in stray capacitance. As a result, miniaturization of the resonant circuit and an electrical characteristic appropriate for broadband application can be achieved.

As a main resonant portion of the resonant circuit 110 according to the embodiment of the present invention, a circuit using an open-terminated transmission line LX1 as shown in FIG. 4 or an short-terminated transmission line LX2 as shown in FIG. 5 may be considered instead of using a combination of the transmission line 115 and the capacitor 116.

When the resonant circuit 110 is formed as a circuit element, an example of external shape of the filter element 130 is as shown in FIG. 6. Described in more details, the filter element 130 is formed by stacking the resonant circuit 110 inside a layered product 131 having a rectangular parallelepiped shape which is made mainly of dielectric ceramics. In addition, on a surface of the layered product 131, external terminal electrodes 132 to 135 are formed. Here, an external terminal electrode 132 corresponds to the input terminal 111, and an external terminal electrode 133 corresponds to the output terminal 112. In addition, external terminal electrodes 134 and 135 are earth terminals.

The shape and disposition of a conductor pattern are shown in FIGS. 7 to 9, when another exemplary BPF to which the resonant circuit 110 is applied is formed inside the multilayered substrate. The conductor pattern shown in FIGS. 7 to 9 implements the circuit illustrated in FIG. 10.

In FIGS. 7 to 9, a reference numeral 140 denotes a multilayered substrate, and the multilayered substrate 140 is made mainly of dielectric ceramics 140a. A filter circuit 190 to be described later is formed by stacking multiple conductor patterns inside the multilayered substrate 240. Described in more details, in the multilayered substrate 140, on both sides of a portion in which the filter circuit 190 is formed, earth conductor patterns 141 and 142 parallel to each other are disposed, respectively. In addition, between the earth conductor patterns 141 and 142, an earth conductor pattern 143 having a predetermined size is formed to be parallel to the earth conductor patterns 141 and 142. The earth conductor pattern 143 is electrically connected to the earth conductor patterns 141 and 142 through a plurality of via conductors 144. In addition, between the earth conductor patterns 141 and 142, an input conductor pattern 150, an output conductor pattern 160, a resonance conductor pattern 170, and a connection conductor pattern 180 are formed.

The input conductor pattern 150 is formed to be parallel to the earth conductor patterns 141 and 142. The input conductor pattern 150 includes a second main resonant portion including an input strip line 151, a capacitor electrode 152 of a second capacitor portion connected thereto, a strip line 153 of which one end is connected to the capacitor electrode 152, and a capacitor electrode 154 which is connected to the other end of the strip line 153. Here, only the capacitor electrode 154 is disposed to face the earth conductor pattern 143.

The output conductor pattern 160 is formed to be parallel to the earth conductor patterns 141 and 142 and to be on a same side as the input conductor pattern 150. The output conductor pattern 160 includes a third main resonant portion including an output strip line 161, a capacitor electrode 162 of a third capacitor portion connected thereto, a strip line 163 of which one end is connected to the capacitor electrode 162 and which is disposed parallel to the strip line 153, and a capacitor electrode 164 which is connected to the other end of the strip line 163. Here, only the capacitor electrode 164 is disposed to face the earth conductor pattern 143.

The resonance conductor pattern 170 includes a first main resonant portion including a strip line 171 which is interposed between the input and output conductor patterns 150 and 160, formed to be on a same side as the input and output conductor patterns 150 and 160, and disposed to be parallel to the strip line 153 and a capacitor electrode 172 which is connected to one end of the strip line 171. Here, only the capacitor electrode 172 is disposed to face the earth conductor pattern 143.

The connection conductor pattern 180 is disposed by disposing dielectric ceramics 140a on a layer different from a layer on which the input conductor pattern 150, the output conductor pattern 160, and the resonance conductor pattern 170 are disposed. The connection conductor pattern 180 includes a conduction pattern forming a capacitor electrode 181 of the second capacitor portion which is disposed to face the capacitor electrode 152, a capacitor electrode 185 of the third capacitor portion which is disposed to face the capacitor electrode 162, a strip line 182 of which one end is connected to the capacitor electrode 181, a connection electrode 183 which is connected to the other end of the strip line 182, a strip line 184 of which one end is connected to the connection electrode 183 and the other end is connected to the capacitor electrode 185, and a capacitor electrode 186 of the first capacitor portion which is connected to the capacitor electrode 181 of the first capacitor portion into one body and a capacitor electrode 187 of the first capacitor portion of which an open end portion is disposed to face an open end portion of the capacitor electrode 186 by interposing the dielectric ceramics 140a, and the other end is connected to the capacitor electrode 185 through a via conductor 188. In addition, the connection electrode 183 is connected to one end of the strip line 171 through a via conductor 173.

The filter circuit which is formed inside the multilayered substrate 140 of FIGS. 7 to 9 is as shown in FIG. 10. In the aforementioned structure, circuit components of the equivalent circuit shown in FIG. 10 are as below.

A transmission line 193 connected to an input terminal 191 is constructed by the strip line 153, and a capacitor 121 is constructed by the capacitor electrodes 152 and 181. In addition, a transmission line 113 is constructed by the strip line 182.

In addition, a transmission line 194 which is connected to an output terminal 192 is constructed by the strip line 163, and a capacitor 122 is constructed by the capacitor electrodes 162 and 185. In addition, a transmission line 114 is constructed by the strip line 184.

In addition, a main resonant circuit including the transmission line 115 and the capacitor 116 is constructed by the strip line 171, and the capacitor electrode 172, and the earth conductor pattern 143.

The capacitor CA connected between then input terminal of the input transmission line 113 and the output terminal of the output transmission line 114 includes the capacitor electrode 186 and the capacitor electrode 187 which is disposed to face the capacitor electrode 186.

A serial resonant circuit including the transmission line 193 which is connected to the input terminal 191 and the capacitor 195 includes the strip line 153, the capacitor electrode 154, and the earth conductor pattern 143. In addition, a series resonant circuit including the transmission line 194 which is connected to the output terminal 192 and the capacitor 196 includes the strip line 163, the capacitor electrode 164, and the earth conductor pattern 143.

The frequency characteristic of the filter circuit 190, that is a band-pass filter, having the aforementioned structure, in the multilayered substrate 140 is as shown in FIG. 11. In the figure, a curve A is an attenuation characteristic curve, and a curve B is a reflection amount characteristic curve. In addition, a vertical axis represents an attenuation amount and a reflection amount in units of dB, and a horizontal axis represents a frequency in units of GHz. As the attenuation characteristic curve A in the figure indicates, the attenuation amounts have local maximal values at frequencies of 1.8 GHz, 5.2 GHz, and 11.3 GHz. As the reflection amount characteristic curve B in the figure indicates, the reflection amounts have local minimal values at frequencies of 6.5 GHz, 7.0 GHz, 8.8 GHz, and 10.5 GHz. The filter circuit 190 is designed on the basis of the filter circuit 110 described above to have a pass band of 6 to 10 GHz.

The filter circuit 190 described above is completed by connecting in series three resonant circuits which are implemented in a ceramic multilayered substrate as three stages through a combination of the resonant circuit 110 according to the embodiment of the invention and the general resonant circuit. As the electrical characteristics described above indicate, the BPF 190 having three stages according to the embodiment of the invention has four matching frequencies and an additional attenuation pole at a high frequency (attenuation zone). To the contrary, the general resonant circuit 290 has three matching frequencies and cannot have an additional attenuation pole in an attenuation zone having high frequencies. It is apparent that the BPF 190 using the resonant circuit 110 according to the embodiment of the invention has advantages in broadband and high attenuation characteristics when the electrical characteristics of the BPF 190 according to the embodiment of the invention and the general BPF 190 are compared.

In order to implement the filter element 130 shown in FIGS. 1 and 6, the strip lines 151 and 153 and capacitor electrode 154 which are included in the input conductor pattern 150 shown in FIGS. 7 to 9 and the strip lines 161 and 163 and the capacitor electrode 164 which are included in the output conductor pattern 160 shown in FIGS. 7 to 9 can be removed.

Alternatively, a BPF may be configured by connecting the two or more resonant circuits 110 shown in FIG. 1 in series. As an example, a BPF 300 in FIG. 12 is configured by connecting two resonant circuits 110 between an input terminal 301 and an output terminal 302. A capacitor 312 is common to one resonant circuit serving as the second capacitor (input capacitor) and to the other resonant circuit serving the third capacitor (output capacitor).

The frequency characteristic of the BPF 300 is as shown in FIG. 13. In FIG. 13, a curve A is an attenuation characteristic curve, and a curve B is a reflection amount characteristic curve. In addition, a vertical axis represents an attenuation amount and a reflection amount in units of dB, and a horizontal axis represents a frequency in units of GHz. As the characteristic curve A in the figure indicates, the attenuation amount have local maximal values at frequencies of 4.8 GHz and 17.5 GHz. In addition, as the reflection amount characteristic curve B in the figure indicates, the reflection amounts have local minimal values at frequencies of 6.7 GHz, 8.6 GHz, 12.0 GHz, and 14.3 GHz. The filter circuit 300 is designed to have a pass band of 6 to 10 GHz.

In addition, a BPF 400 in FIG. 14 is configured by connecting three resonant circuits 110 in series between an input terminal 401 and an output terminal 402.

The frequency characteristic of the BPF 400 is as shown in FIG. 15. In FIG. 15, a curve A is an attenuation characteristic curve, and a curve B is a reflection amount characteristic curve. In addition, a vertical axis represents an attenuation amount and a reflection amount in units of dB, and a horizontal axis represents a frequency in units of GHz. As the attenuation characteristic curve A in the figure indicates, the attenuation amount have local maximal values at frequencies of 4.5 GHz, 5.0 GHz, 16.5 GHz, and 20.0 GHz. As the reflection amount characteristic curve B in the figure indicates, the reflection amounts have local minimal values at frequencies of 6.3 GHz, 7.0 GHz, 9.0 GHz, 11.8 GHz, 13.8 GHz, and 14.8 GHz. The filter circuit 400 is designed to have a pass band of 6 to 15 GHz.

As described above, by connecting two or more resonant circuits 110 according to an embodiment of the present invention through a capacitor in series, a BPF having superior frequency characteristics can be configured.

What is claimed is:

1. A resonant circuit comprising:
   an input transmission line;
   an output transmission line of which an input terminal is connected to an output terminal of the input transmission line;
   a first capacitor of which one terminal is directly connected to an input terminal of the input transmission line and the other terminal is directly connected to an output terminal of the output transmission line;
   a main resonant portion of which only one terminal is connected to both the output terminal of the input transmission line and the input terminal of the output transmission line;

a second capacitor of which one terminal serves as an input terminal and the other terminal is connected to the input terminal of the input transmission line; and a third capacitor of which one terminal is connected to the output terminal of the output transmission line and the other terminal serves as an output terminal, wherein the main resonant portion comprises a transmission line which is grounded through a fourth capacitor and disposed at a terminal portion of the main resonant portion.

2. A filter circuit comprising one or more resonant circuits including:

an input transmission line;

an output transmission line of which an input terminal is connected to an output terminal of the input transmission line;

a first capacitor of which one terminal is directly connected to an input terminal of the input transmission line and the other terminal is directly connected to an output terminal of the output transmission line;

a first main resonant portion of which only one terminal is connected to both the output terminal of the input transmission line and the input terminal of the output transmission line;

a second capacitor of which one terminal serves as an input terminal and the other terminal is connected to the input terminal of the input transmission line; and a third capacitor of which one terminal is connected to the output terminal of the output transmission line and the other terminal serves as an output terminal, wherein a second main resonant portion is connected to the input terminal of the second capacitor of the one or more resonant circuits; and wherein a third main resonant portion is connected to the output terminal of the third capacitor.

3. A filter circuit comprising two or more resonant circuits including:

an input transmission line;

an output transmission line of which an input terminal is connected to an output terminal of the input transmission line;

a first capacitor of which one terminal is directly connected to an input terminal of the input transmission line and the other terminal is directly connected to an output terminal of the output transmission line;

a first main resonant portion of which only one terminal is connected to both the output terminal of the input transmission line and the input terminal of the output transmission line;

a second capacitor of which one terminal serves as an input terminal and the other terminal is connected to the input terminal of the input transmission line; and a third capacitor of which one terminal is connected to the output terminal of the output transmission line and the other terminal serves as an output terminal, wherein the number of the resonant circuits is two or more; and wherein, a capacitor is common to two adjacent resonant circuits of the two or more resonant circuits serving as the second capacitor to one resonant circuit and as the third capacitor to the other resonant circuit.

4. A multilayered substrate in which an electronic circuit including conductor patterns is buried in a multilayer body, the multilayered substrate including a circuit resonant portion comprising:

an input transmission line portion;

an output transmission line portion of which an input terminal is connected to an output terminal of the input transmission line portion;

a first capacitor portion of which one terminal is directly connected to an input terminal of the input transmission line portion and the other terminal is directly connected to an output terminal of the output transmission line portion;

a main resonant portion of which only one terminal is connected to both the output terminal of the input transmission line portion and the input terminal of the output transmission line portion;

a second capacitor portion which is connected to the input terminal of the input transmission line portion; and a third capacitor portion which is connected to the output terminal of the output transmission line portion, the multilayered substrate, further comprising:

a conductor pattern forming the input transmission line portion, one capacitor electrode of the first capacitor portion, one capacitor electrode including said one terminal of the second capacitor portion, and one capacitor electrode of the third capacitor portion into one body; and a conductor pattern forming one capacitor electrode including said other terminal located on one side of the first capacitor portion which is connected to the third capacitor portion through a via conductor on the other side.

5. The multilayered substrate according to claim 4, wherein each of the input and output transmission line portions is a strip line.

6. A filter circuit comprising one or more resonant circuits including:

an input transmission line;

an output transmission line of which an input terminal is connected to an output terminal of the input transmission line;

a first capacitor of which one terminal is connected to an input terminal of the input transmission line and the other terminal is connected to an output terminal of the output transmission line;

a first main resonant portion of which one terminal is connected to an output terminal of the input transmission line;

a second capacitor of which one terminal serves as an input terminal and the other terminal is connected to the input terminal of the input transmission line; and a third capacitor of which one terminal is connected to the output terminal of the output transmission line and the other terminal serves as an output terminal, wherein the number of the resonant circuits is two or more, and wherein a capacitor common to two adjacent resonant circuits of the two or more resonant circuits serves as the second capacitor to one resonant circuit and as the third capacitor to the other resonant circuit.

7. A multilayered substrate in which an electronic circuit including conductor patterns is buried in a multilayer body, the multilayered substrate including a circuit resonant portion comprising:

an input transmission line portion;

an output transmission line portion of which an input terminal is connected to an output terminal of the input transmission line portion;

a first capacitor portion of which one terminal is connected to an input terminal of the input transmission line portion and the other terminal is connected to an output terminal of the output transmission line portion;

a main resonant portion of which one terminal is connected to an output terminal of the input transmission line portion;

a second capacitor portion which is connected to the input terminal of the input transmission line portion;

a third capacitor portion which is connected to the output terminal of the output transmission line portion;

a conductor pattern forming the input transmission line portion, one capacitor electrode of the first capacitor portion, one capacitor electrode including said one terminal of the second capacitor portion, and one capacitor electrode of the third capacitor portion into one body; and a conductor pattern forming one capacitor electrode including said other terminal located on one side of the first capacitor portion which is connected to the third capacitor portion through a via conductor on the other side.

8. The multilayered substrate according to claim 7, wherein each of the input and output transmission line portions is a strip line.

* * * * *